United States Patent
Oh et al.

(10) Patent No.: US 8,927,327 B2
(45) Date of Patent: Jan. 6, 2015

(54) METHOD OF MANUFACTURING ORGANIC LIGHT EMITTING DISPLAY DEVICE HAVING POLARIZABLE PARTICLES IN SEALANT

(71) Applicant: Samsung Display Co., Ltd., Yongin, Gyeonggi-do (KR)

(72) Inventors: Min-Ho Oh, Yongin (KR);
Yoon-Hyeong Cho, Yongin (KR);
Byoung-Duk Lee, Yongin (KR);
So-Young Lee, Yongin (KR);
Sun-Young Lee, Yongin (KR);
Jong-Hyuk Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/054,441

(22) Filed: Oct. 15, 2013

(65) Prior Publication Data

US 2014/0154820 A1 Jun. 5, 2014

Related U.S. Application Data

(62) Division of application No. 12/948,402, filed on Nov. 17, 2010, now Pat. No. 8,586,970.

(30) Foreign Application Priority Data

Dec. 4, 2009 (KR) .................. 10-2009-0119907

(51) Int. Cl.
*H01L 51/40* (2006.01)
*H01L 51/52* (2006.01)
*H01L 29/08* (2006.01)
*H01L 35/24* (2006.01)
*H01J 1/62* (2006.01)
*H01J 63/04* (2006.01)
*G02F 1/1339* (2006.01)
*G02F 1/1333* (2006.01)

(52) U.S. Cl.
CPC .................. *H01L 51/5246* (2013.01)
USPC ............... 438/99; 257/40; 313/505; 313/506; 313/507; 313/512; 349/153

(58) Field of Classification Search
None
See application file for complete search history.

(56) References Cited

U.S. PATENT DOCUMENTS 6,870,656 B2    3/2005  Tonar et al.
8,188,509 B2 *  5/2012  Lee .............................. 257/100

(Continued)

FOREIGN PATENT DOCUMENTS

JP    7228847 A     8/1995
JP    2004-241364 A  8/2004

(Continued)

OTHER PUBLICATIONS

Definition of application. (n.d.) The American Heritage® Dictionary of the English Language, Fourth Edition. (2003). Retrieved Jun. 3, 2014 from http://www.thefreedictionary.com/application.*

(Continued)

*Primary Examiner* — Michael Jung
(74) *Attorney, Agent, or Firm* — Robert E. Bushnell, Esq.

(57) ABSTRACT

There is provided an organic light emitting display device including a first substrate; an organic light emitting unit formed on the first substrate; a second substrate disposed on the organic light emitting unit; and an adhesive unit for adhering the first substrate and the second substrate to each other, wherein the adhesive unit includes a sealant, and particles that are arranged in the sealant so as to block penetration of external impurities. There is further provided a method of manufacturing the organic light emitting display device.

14 Claims, 4 Drawing Sheets

(56) References Cited

U.S. PATENT DOCUMENTS

| | | |
|---|---|---|
| 2004/0150328 A1 * | 8/2004 | Czerw et al. .................. 313/506 |
| 2007/0096633 A1 | 5/2007 | Lee et al. |
| 2009/0291608 A1 | 11/2009 | Choi et al. |
| 2010/0090596 A1 | 4/2010 | Ota |
| 2010/0270919 A1 | 10/2010 | Hubert et al. |

FOREIGN PATENT DOCUMENTS

| | | |
|---|---|---|
| JP | 2005010570 A | 1/2005 |
| JP | 2008096524 A | 4/2005 |
| JP | 2007065215 A | 3/2007 |
| KR | 10-2007-0037265 A | 4/2007 |
| KR | 10-2008-0107220 A | 12/2008 |
| KR | 10-2009-0073362 A | 7/2009 |
| WO | 2008/078648 A1 | 7/2008 |

OTHER PUBLICATIONS

Korean Office Action issued by Korean Patent Office on Feb. 1, 2011 in the corresponding Korean Application No. 10-2009-0119907.

Korean Office Action issued by the Korean Patent Office on Sep. 9, 2011 in the corresponding Korean Patent application No. 2009-0119907.

* cited by examiner

METHOD OF MANUFACTURING ORGANIC LIGHT EMITTING DISPLAY DEVICE HAVING POLARIZABLE PARTICLES IN SEALANT

CROSS-REFERENCE TO RELATED PATENT APPLICATION

This application claims the benefit of Korean Patent Application No. 10-2009-0119907, filed on Dec. 4, 2009 in the Korean Intellectual Property Office, the disclosure of which is incorporated herein in its entirety by reference. Furthermore, this application is filed pursuant to U.S.C. §121 as a Divisional application of Applicant's patent application Ser. No. 12/948,402 filed in the U.S. Patent & Trademark Office on 17 Nov. 2010, and assigned to the assignee of the present invention. All benefits accruing under 35 U.S.C. §120 from the aforesaid present application Ser. No. 12/948,402 are also claimed.

BACKGROUND OF THE INVENTION

1. Field of the Invention

The present invention relates to an organic light emitting display device and a method of manufacturing the organic light emitting display device, and more particularly, to an organic light emitting display device for preventing the penetration of external moisture and other external impurities, and a method of manufacturing the organic light emitting display device.

2. Discussion of Related Art

Generally, a flat display device may be largely classified into a light emitting type flat display device and a light receiving type flat display device. Examples of the light emitting type flat display device may include a flat cathode ray tube, a plasma display panel, an electro luminescent device, and a light emitting diode. Examples of the light receiving type flat display device may include a liquid crystal display device. The electro luminescent device has a wide viewing angle, excellent contrast, and fast response speed, and thus the electro luminescent device is attracting attention as the next generation of display devices. The electro luminescent device is classified into an inorganic electro luminescent device and an organic electro luminescent device according to the material used to form the electro luminescent device.

The organic electro luminescent device is a self-emissive device that emits light by electrically exciting a fluorescent organic compound, is driven by a low voltage, is easily miniaturized, and has a wide viewing angle and fast response speed. Since these characteristics are related to problems to be overcome in the liquid crystal display device, the organic electro luminescent device is attracting attention as the next generation of display devices.

The organic electro luminescent device includes an emission layer (EML) formed of an organic material and disposed between an anode and a cathode. In the organic electro luminescent device, when an anode voltage and a cathode voltage are applied to the anode and the cathode, respectively, a hole injected from the anode is moved to the EML via a hole transport layer (HTL), an electron is moved from the cathode to the EML via an electron transport layer (ETL), and the hole and the electron recombine in the EML to generate excitons.

As the excitons change from an excitation state to a ground state, a fluorescence molecule of the EML emits light to form an image. A full color type organic electro luminescent device includes a pixel exhibiting three colors of red (R), green (G) and blue (B), thereby realizing full-color.

The full color type organic electro luminescent device includes pixel define layers on both ends of an anode. A predetermined opening is formed in the pixel define layer, and then an EML and a cathode are sequentially formed on a portion of the anode, which is exposed from the opening of the pixel define layer.

SUMMARY OF THE INVENTION

According to an aspect of the present invention, there is provided an organic light emitting display device including a first substrate; an organic light emitting unit formed on the first substrate; a second substrate disposed on the organic light emitting unit; and an adhesive unit for adhering the first substrate and the second substrate to each other, wherein the adhesive unit includes a sealant, and particles that are arranged in the sealant so as to block penetration of external impurities.

The particles may be arranged in a direction from the first substrate towards the second substrate.

The particles may form a plurality of blocking units that are each arranged in a column in a direction from the first substrate towards the second substrate.

The particles may be arranged in a chained shape in a direction from the first substrate towards the second substrate.

The particles may include a material having polarization characteristics in the sealant due to an electric field or a magnetic field.

The particles may include an organic material having polarization characteristics.

The organic material may be one selected from the group consisting of polyaniline, polypyrrole, poly (p-phenylene), poly naphthalene quinine radicals, poly acene quinone radicals, poly phenylenediamine, and polythiophene.

The particles may include an inorganic material having polarization characteristics.

The inorganic material may be one selected from the group consisting of silica gel, silica, zeolite, and a mesoporous material.

The sealant may include an insulating material.

The sealant may include one selected from the group consisting of silicon, epoxy, and acryl.

According to another aspect of the present invention, there is provided a method of manufacturing an organic light emitting display device, including forming an organic light emitting unit on a first substrate; coating an adhesive unit on a second substrate; adhering the first substrate and the second substrate to each other so that the adhesive unit is surrounds the organic light emitting unit; applying an electric field or a magnetic field to the adhesive unit; and hardening the adhesive unit so as to adhere the first substrate and the second substrate to each other.

The adhesive unit may include a sealant, and particles that are dispersed in the sealant.

The particles may have polarization characteristics.

The application of the electric field or the magnetic field may include applying the electric field or the magnetic field in a direction from the first substrate towards the second substrate, or applying the electric field or the magnetic field in a direction from the second substrate towards the first substrate; and arranging the particles in a direction of the electric field or the magnetic field.

The particles may form a plurality of blocking units that are each arranged in a column in a direction from the first substrate towards the second substrate.

The particles may be arranged in a chained shape in a direction from the first substrate towards the second substrate.

The particles may include an organic material having polarization characteristics.

The organic material may be one selected from the group consisting of polyaniline, polypyrrole, poly(p-phenylene), poly naphthalene quinine radicals, poly acene quinone radicals, poly phenylenediamine, and polythiophene.

The particles may include an inorganic material having polarization characteristics.

The inorganic material may be one selected from the group consisting of silica gel, silica, zeolite, and a mesoporous material.

The sealant may include an insulating material.

The sealant may include one selected from the group consisting of silicon, epoxy, and acryl.

The hardening of the adhesive unit may be performed by heating the adhesive unit.

The hardening of the adhesive unit may be performed by applying ultraviolet rays to the adhesive unit.

The hardening of the adhesive unit may be performed when the electric field or the magnetic field is applied to the adhesive unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
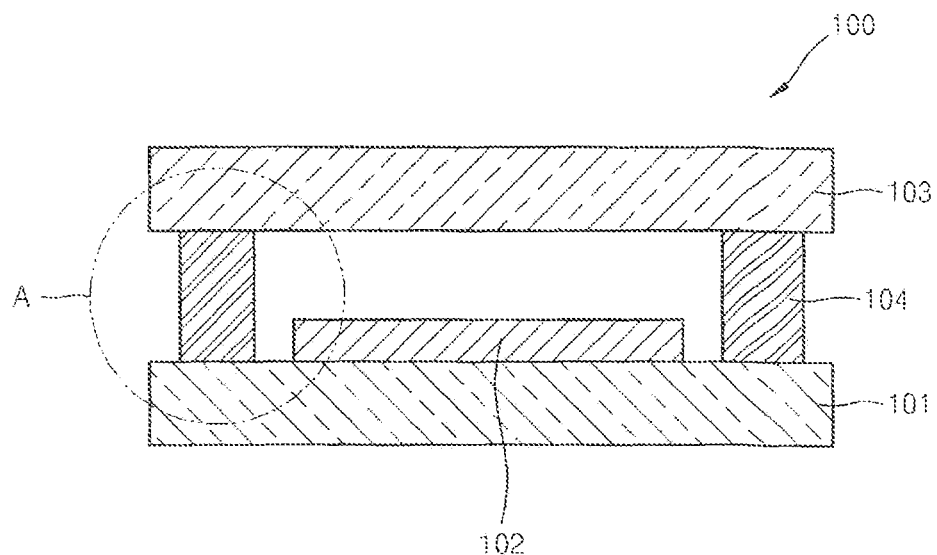
FIG. 1 is a cross-sectional view of an organic light emitting display device according to an embodiment of the present invention.
Figure 2:
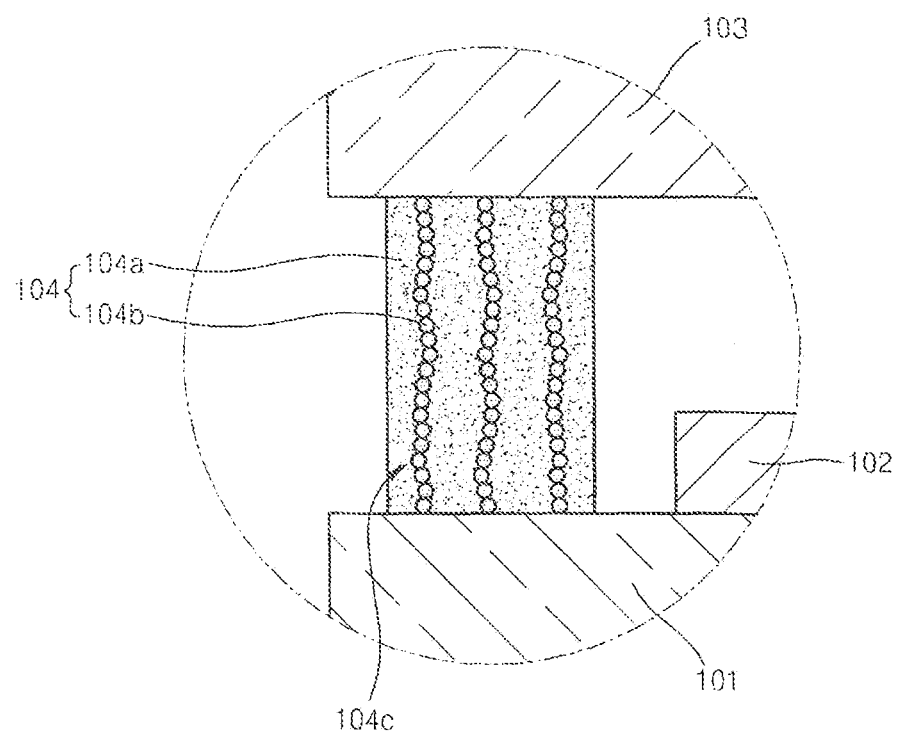
FIG. 2 is an enlarged diagram of a portion 'A' of FIG. 1, according to an embodiment of the present invention.
Figure 3:
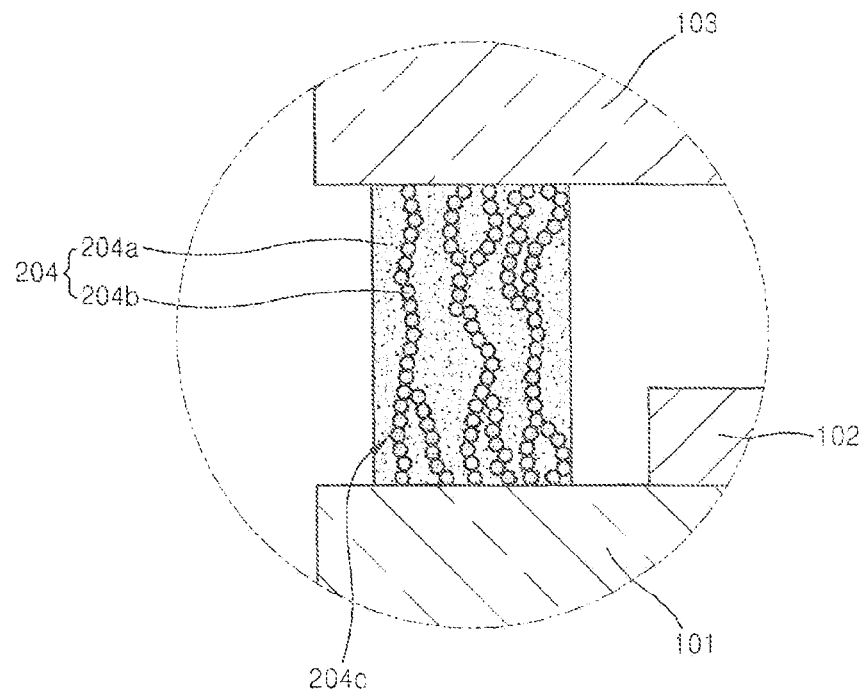
FIG. 3 is a schematic cross-sectional view of an adhesive unit of the organic light emitting display device of FIG. 1, according to another embodiment of the present invention.

FIG. 1 is a cross-sectional view of an organic light emitting display device 100 according to an embodiment of the present invention. FIG. 2 is an enlarged diagram of a portion 'A' of FIG. 1, according to an embodiment of the present invention. FIG. 3 is a schematic cross-sectional view of an adhesive unit 104 of the organic light emitting display device 100 of FIG. 1, according to another embodiment of the present invention.

Referring to FIG. 1, the organic light emitting display device 100 may include a first substrate 101, an organic light emitting unit 102, a second substrate 103 and an adhesive unit 104.

The organic light emitting unit 102 includes an organic light emitting device and is disposed on the first substrate 101. Various plastic substrates as well as a glass substrate may be used as the first substrate 101. In addition, a metallic substrate may be used as the first substrate 101. If necessary, a buffer layer (not shown) may be disposed on the first substrate 101.

The organic light emitting unit 102 may include a plurality of organic light emitting devices. The organic light emitting device of the organic light emitting unit 102 includes a pixel electrode, a counter electrode facing the pixel electrode, and an intermediate layer including at least one emission layer (EML) interposed between the pixel electrode and the counter electrode. The pixel electrode may be used as a transparent electrode or a reflective electrode. When the pixel electrode is used as a transparent electrode, the pixel electrode may be formed of at least one selected from the group consisting of ITO, IZO, ZnO and $In_2O_3$. When the pixel electrode is used as a reflective electrode, the pixel electrode may include a reflective layer formed of one selected from the group consisting of Ag, Mg, Al, Pt, Pd, Au, Ni, Nd, Ir, Cr and combinations thereof, and a layer formed of at least one selected from the group consisting of ITO, IZO, ZnO and $In_2O_3$ and disposed on the reflective layer. The counter electrode may be used as a transparent layer or a reflective layer. When the counter electrode is used as a transparent electrode, the counter electrode may include a layer formed of one selected from the group consisting of Li, Ca, LiF/Ca, LiF/Al, Al, Mg and combinations thereof and formed to face the intermediate layer formed between the pixel electrode and the counter electrode, and an auxiliary electrode or bus electrode line that is formed on the layer and is formed of a material for a transparent electrode, such as ITO, IZO, ZnO and $In_2O_3$. When the counter electrode is used as a reflective electrode, the counter electrode may be formed by depositing one selected from the group consisting of Li, Ca, LiF/Ca, LiF/Al, Al, Mg and combinations thereof. The intermediate layer formed between the pixel electrode and the counter electrode may be formed of a small molecular weight organic material or a polymer organic material. When the intermediate layer is formed of a small molecular weight organic material, the intermediate layer may be formed by stacking a hole injection layer (HIL), a hole transport layer (HTL), an emission layer (EML), an electron transport layer (ETL), and an electron injection layer (EIL) in a single or complex structure. An organic material used for forming the intermediate layer may be copper phthalocyanine (CuPc), N,N'-Di(naphthalene-1-yl)-N,N' -diphenyl-benzidine (NPB), tris-8-hydroxyquinoline aluminum (Alq3), or the like. The intermediate layer may be formed of a small molecular weight organic material by using a vacuum deposition method. When the intermediate layer is formed of a polymer organic material, the intermediate layer may include a structure including a HTL and an EML. In this case, the HTL may be formed of poly-(2,4)-ethylene-dihydroxy thiophene (PEDOT). In addition, the EML may be formed of a polymer organic material such as poly-phenylenevinylene (PPV), and polyfluorene.

The second substrate 103 is disposed on the first substrate 101 so as to cover the organic light emitting unit 102. Various plastic substrates such as an acrylic substrate as well as a glass substrate may be used as the second substrate 103.

The adhesive unit 104 is disposed between the first substrate 101 and the second substrate 103 so as to adhere the first substrate 101 and the second substrate 103 to each other. The adhesive unit 104 may be disposed between the first substrate 101 and the second substrate 103 so as to surround the organic light emitting unit 102 formed on the first substrate 101. The adhesive unit 104 may include a sealant 104a and particles 104b.

The particles 104b may form at least one arrangement in the sealant 104a. As shown in FIG. 2, the particles 104b may form at least one blocking unit 104c that is arranged in a column According to another embodiment of the present invention, as shown in FIG. 3, particles 204b may form a blocking unit 204c that is arranged in a chained shape. The particles 104b and 204b may be arranged in a direction from the first substrate 101 towards the second substrate 103 in the sealants 104a and 204a so as to form the blocking units 104c and 204c, respectively.

The sealants 104a and 204a may be formed any one of silicon, epoxy, acryl, and the like. The particles 104b and 204b may include an organic or inorganic material having polarization characteristics. Examples of the organic material having polarization characteristics and for forming the particles 104b and 204b may include polyaniline, polypyrrole, poly(p-phenylene), poly naphthalene quinine radicals, poly acene quinone radicals, poly phenylenediamine, and polythiophene. Examples of the inorganic material used for forming the particles 104b and 204b may include silica gel, silica, zeolite, and a mesoporous material.

The particles 104b and 204b may be arranged in a direction from the first substrate 101 towards the second substrate 103 (or in a direction from the second substrate 103 towards the first substrate 101) to form at least one of the blocking units 104c and 204c, respectively, thereby preventing external moisture and other external impurities from penetrating into the organic light emitting unit 102 through the sealants 104a and 204a.

Figure 4:
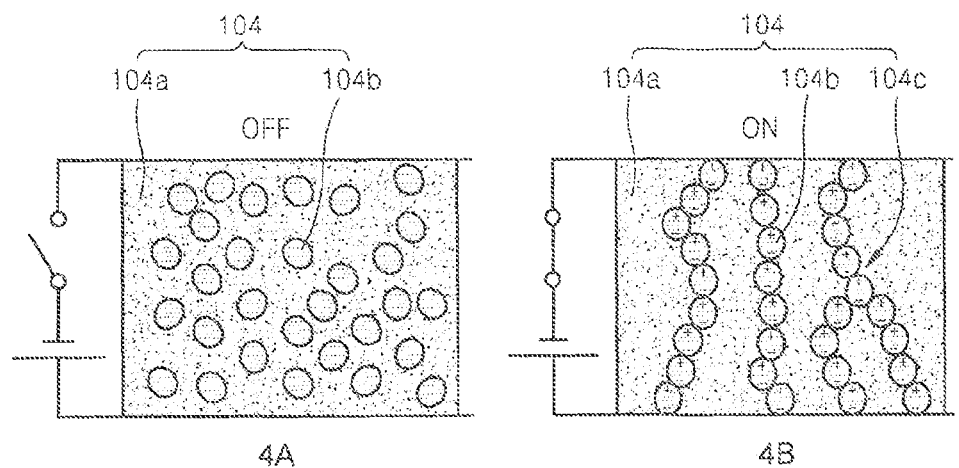
FIGS. 4A and 4B show arrangements of particles, according to embodiments of the present invention.

FIGS. 4A and 4B show arrangements of the particles 104b and 204b, according to embodiments of the present invention. FIG. 4A shows a case where an electric field is not applied to the adhesive unit 104, according to an embodiment of the present invention. FIG. 4B shows a case where an electric field is applied to the adhesive unit 104, according to another embodiment of the present invention.

Referring to FIG. 4A, when an electric field or a magnetic field is not applied, the particles 104b of the adhesive unit 104 are dispersed in the sealant 104a. That is, the particles 104a are not regularly arranged, and exist randomly in the sealant 104a. However, as shown in FIG. 4B, when an electric field or a magnetic filed is applied to the adhesive unit 104, the particles 104b of the sealant 104a are polarized so as to be arranged according to a direction of the electric field or the magnetic field. That is, when an electric field is applied to the adhesive unit 104, the particles 104b are polarized each with a positive (+) polarity and a negative (−) polarity, the positive (+) polarity and the negative (−) polarity contact each other, and thus forming the blocking units 104c arranged along a direction of the electric field. Although not illustrated in FIGS. 4A and 4B, when a magnetic field is not applied, the particles 104b are polarized each with an N polarity and an S polarity, the N polarity and the S polarity contact each other, and thus forming the particles 104b that may be arranged along a direction of the magnetic field.

FIGS. 5 through 8 are cross-sectional views of a method of manufacturing an organic light emitting display device, according to an embodiment of the present invention.

Figure 5:
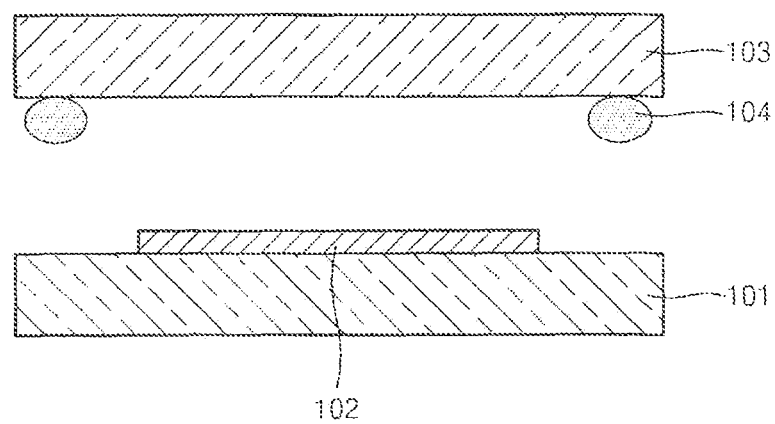
FIGS. 5 through 8 are cross-sectional views of a method of manufacturing an organic light emitting display device, according to an embodiment of the present invention.

Referring to FIG. 5, an organic light emitting unit 102 is formed on a first substrate 101. In the case of an active matrix organic light emitting device (AMOLED), the organic light emitting unit 102 may be formed as a plurality of organic thin films including an EML formed on a thin film transistor (TFT).

An adhesive unit 104 may be coated on a second substrate 103. When the first substrate 101 and the second substrate 103 are adhered to each other, the adhesive unit 104 may be coated on an edge portion of the second substrate 103 so as to surround the organic light emitting unit 102.

Figure 6:
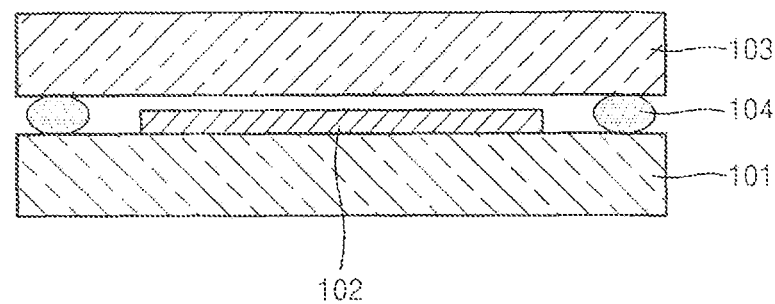

Then, as shown in FIG. 6, the first substrate 101 and the second substrate 103 are adhered to each other. The organic light emitting unit 102 is disposed between the first substrate 101 and the second substrate 103, and the adhesive unit 104 surrounds an outer side of the organic light emitting unit 102.

In the current operation, particles of the adhesive unit 104 are randomly dispersed in a sealant.

Figure 7:
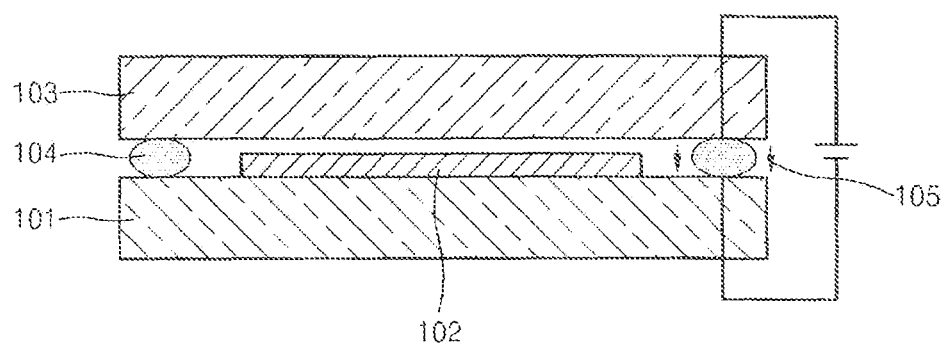

Then, as shown in FIG. 7, an electric field 105 is applied to the adhesive unit 104. The particles of the adhesive unit 104 are polarized in a sealant by applying the electric field to the adhesive unit 104, and the particles are arranged in a direction from the first substrate 101 towards the second substrate 103 (or in a direction from the second substrate 103 towards the first substrate 101), which is a direction of the electric field so as to form at least one blocking unit. The penetration of external moisture and other external impurities into the organic light emitting unit 102 may be blocked by the blocking unit, thereby increasing the lifetime of the organic light emitting display device.

Figure 8:
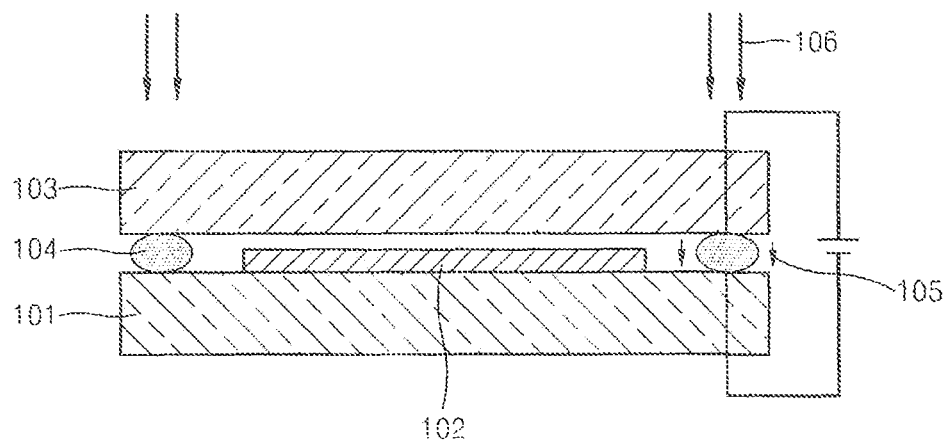

Lastly, as shown in FIG. 8, when an electric field or a magnetic field is applied to the adhesive unit 104, the adhesive unit 104 is hardened by applying heat or ultraviolet rays to the adhesive unit 104. That is, by hardening the adhesive unit 104 in which the particles are arranged along a direction of the electric field or magnetic field, a state of the blocking unit in which the particles are regularly arranged may be maintained without the electric field or magnetic field.

According to embodiments of the present invention, in an organic light emitting display device and a method of manufacturing the organic light emitting display device, the penetration of external moisture and other external impurities into an organic light emitting unit may be blocked by a blocking unit, thereby increasing the lifetime of the organic light emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display device, the method comprising;
   forming an organic light emitting unit on a first substrate;
   coating an adhesive unit on a second substrate;
   adhering, the first substrate and the second substrate to each other so that the adhesive unit surrounds the organic light emitting unit;
   applying an electric field or a magnetic field to the adhesive unit; and
   hardening the adhesive unit so as to adhere the first substrate and the second substrate to each other, wherein
   the adhesive unit comprises a sealant and particles that are dispersed in the sealant.

2. The method of claim 1, wherein the particles are polarizable.

3. The method of claim 2, wherein the applying of the electric field or the magnetic field comprises:
   applying the electric field lines or the magnetic field lines in a direction generally perpendicular to the first substrate and the second substrate; and
   arranging the particles in the direction of the electric field lines or the magnetic field lines.

4. The method of claim 3, wherein the particles form a plurality of chains that arc each arranged in a direction generally perpendicular to the first substrate and the second substrate.

5. The method of claim 2, wherein the particles are linearly arranged end to end between the first substrate and the second substrate.

6. The method of claim 2, wherein the particles comprise a polarizable organic material.

7. The method of claim 6, wherein the organic Material is one selected from the group consisting of polyaniline, polypyrrole, poly(p-phenylene), poly naphthalene quinine radicals, poly acene quinone radicals, poly phenylenediamine, and polythiophene.

8. The method of claim 2, wherein the particles comprise a polarizable inorganic material.

9. The method of claim 8, wherein the inorganic material is one selected from the group consisting of silica gel, silica, zeolite, and a mesoporous material.

10. The method of claim 1 wherein the sealant comprises an insulating material.

11. The method of claim 10, wherein the, sealant comprises one selected from the group consisting of silicon, epoxy, and acryl.

12. The method of claim 1, wherein the hardening cat the adhesive unit is performed by heating, the adhesive unit.

13. The method of claim 1, wherein the hardening of the adhesive unit is performed by applying ultraviolet rays to the adhesive unit.

14. The method of claim 1, wherein the hardening of the adhesive unit is performed when the electric field or the magnetic field is applied to the adhesive unit.

* * * * *